(12) United States Patent
Matsumura et al.

(10) Patent No.: US 11,982,712 B2
(45) Date of Patent: May 14, 2024

(54) TERMINAL MODULE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Nobuyuki Matsumura, Mie (JP); Hiroki Shimoda, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 475 days.

(21) Appl. No.: 17/295,285

(22) PCT Filed: Nov. 1, 2019

(86) PCT No.: PCT/JP2019/042998
§ 371 (c)(1),
(2) Date: May 19, 2021

(87) PCT Pub. No.: WO2020/105398
PCT Pub. Date: May 28, 2020

(65) Prior Publication Data
US 2022/0013871 A1 Jan. 13, 2022

(30) Foreign Application Priority Data
Nov. 22, 2018 (JP) .................................. 2018-219042

(51) Int. Cl.
*H01R 11/12* (2006.01)
*G01R 31/364* (2019.01)
(Continued)

(52) U.S. Cl.
CPC .......... *G01R 31/364* (2019.01); *H01M 50/50* (2021.01); *H01M 50/505* (2021.01);
(Continued)

(58) Field of Classification Search
CPC ........................... H01M 50/50; H01M 50/569
See application file for complete search history.

(56) References Cited

U.S. PATENT DOCUMENTS

| 9,153,849 B2 | 10/2015 | Ogasawara et al. |
| 2001/0044241 A1* | 11/2001 | Saito ................... H01M 50/503 439/736 |

(Continued)

FOREIGN PATENT DOCUMENTS

| JP | 2012-164591 | 8/2012 |
| JP | 2015-005473 | 1/2015 |

(Continued)

OTHER PUBLICATIONS

Official Communication issued in International Bureau of WIPO Patent Application No. PCT/JP2019/042998, dated Jan. 28, 2020, along with an English translation thereof.

*Primary Examiner* — Maria Laios
*Assistant Examiner* — Jordan E Berresford
(74) *Attorney, Agent, or Firm* — GREENBLUM & BERNSTEIN, P.L.C.

(57) ABSTRACT

A configuration is adopted in which a terminal module includes a voltage detection terminal having a terminal connection part connected to an electrode terminal and a wire connection part connected to a wire, and a protector housing at least part of the voltage detection terminal, with two liquid draining parts each including a first extension part extending downward in the direction of gravity being provided between the terminal connection part and the wire connection part in the voltage detection terminal, and the (Continued)

protector having a housing part housing the liquid draining parts and accumulating liquid that travels along the first extension part.

11 Claims, 15 Drawing Sheets

(51) Int. Cl.
*H01M 50/50* (2021.01)
*H01M 50/505* (2021.01)
*H01M 50/55* (2021.01)
*H01M 50/553* (2021.01)
*H01M 50/569* (2021.01)
*H01M 50/103* (2021.01)

(52) U.S. Cl.
CPC ......... *H01M 50/55* (2021.01); *H01M 50/553* (2021.01); *H01M 50/569* (2021.01); *H01R 11/12* (2013.01); *H01M 50/103* (2021.01)

(56) References Cited

U.S. PATENT DOCUMENTS

| | | |
|---|---|---|
| 2018/0248280 A1 | 8/2018 | Takahashi et al. |
| 2018/0261822 A1 | 9/2018 | Takahashi et al. |
| 2018/0261953 A1 | 9/2018 | Takahashi et al. |

FOREIGN PATENT DOCUMENTS

| | | |
|---|---|---|
| JP | 2015-035322 | 2/2015 |
| JP | 2017-059468 | 3/2017 |
| WO | 2017/047371 | 3/2017 |
| WO | 2017/047372 | 3/2017 |

* cited by examiner

TERMINAL MODULE

TECHNICAL FIELD

The technology disclosed in this specification relates to a terminal module.

BACKGROUND ART

A known voltage detection terminal for detecting the voltage of a battery is disclosed in JP 2012-164591A (hereinafter, Patent Document 1), for example. This voltage detection terminal is connected to the end of a wire extending from a device such as a voltage detector or an ECU (Electronic Control Unit), and is stacked on and connected to a bus bar that connects electrodes of a battery.

CITATION LIST

Patent Documents

Patent Document 1: JP 2012-164591A

SUMMARY OF INVENTION

Technical Problem

Incidentally, liquid such as water droplets may adhere to bus bars for connecting electrodes. For example, condensation may occur on the bus bar when the temperature of the bus bar decreases at times such as when a vehicle is stationary. When liquid such as water droplets adhering to the bus bar reaches wires via the voltage detection terminal, the liquid infiltrates the voltage detector or ECU through the wires and causes problems.

This specification discloses a technology for inhibiting liquid from reaching wires.

Solution to Problem

The technology disclosed in this specification includes a terminal having a terminal connection part to be connected to an electrode terminal and a wire connection part to be connected to a wire, and a protector that houses at least part of the terminal, with at least one liquid draining part including a first extension part extending in a direction of gravity being provided between the terminal connection part and the wire connection part in the terminal, and the protector having a housing part that houses the liquid draining part.

According to a terminal module having such a configuration, liquid adhering to the terminal connection part travels along the first extension part of the liquid draining part and accumulates in the housing part from a lower end part of the first extension part, thus enabling liquid to be inhibited from reaching the wire connection part. Liquid can thereby be inhibited from reaching the wires and causing problems with other devices and the like.

The terminal module disclosed in this specification may be configured as follows. A configuration may be adopted in which the electrode terminal is provided in a device main body of a power storage device, and the first extension part extends along a lateral surface of the device main body.

According to such a configuration, the first extension part of the liquid draining part extends along the lateral surface of the device main body, thus enabling the length dimension of the first extension part to be set larger, compared with the case where the first extension part is disposed on an upper part of the device main body, for example. In other words, liquid can be guided by the first extension part to a position away from the wire connection part, thus enabling liquid to be further inhibited from reaching the wire connection part.

A configuration may be adopted in which the electrode terminal is provided in a device main body of a power storage device, and the housing part is disposed laterally of the device main body.

According to such a configuration, the housing part is disposed laterally of the device main body, thus enabling the overall height dimension of the power storage device to which the terminal module is attached to be inhibited from becoming larger, compared with the case where the housing part is disposed on an upper part of the device main body of the power storage device, for example.

A configuration may be adopted in which the liquid draining part further has a second extension part extending in an opposite direction to the direction of gravity, and a bent part joining an extension end part of the first extension part and a base end part of the second extension part in a bent state, and the housing part has a bottom wall facing the bent part with a gap to the bent part.

According to such a configuration, liquid that travels along the first extension part is pulled by surface tension into the gap between the bent part of the liquid draining part and the bottom wall of the housing part, and the liquid readily collects in the housing part, thus enabling liquid to be further inhibited from reaching the wire connection part.

A configuration may be adopted in which a plurality of the liquid draining part are provided between the terminal connection part and the wire connection part, and the housing part has individual housing parts individually housing the plurality of liquid draining parts.

According to such a configuration, a plurality of liquid draining parts are provided between the terminal connection part and the wire connection part, thus enabling liquid to be inhibited from reaching the wire connection part.

Incidentally, in the case where a plurality of liquid draining parts are collectively housed in one housing part, for example, there is concern that liquid that has dropped into the housing part from the liquid draining part nearest the terminal connection part will travel along the bottom wall and reach the liquid draining part nearest the wire connection part. However, according to such a configuration, each liquid draining part is individually housed in an individual housing part, thus enabling liquid that has dropped from each liquid draining part to be prevented from traveling along the bottom wall and reaching other liquid draining parts.

A configuration may be adopted in which the individual housing parts have a first lateral wall extending along the first extension part and a second lateral wall extending along the second extension part, and a gap dimension between the first extension part and the first lateral wall is set smaller than a gap dimension between the second extension part and the second lateral wall.

According to such a configuration, liquid adhering to the liquid draining parts is pulled by surface tension into the gap between the first extension part and the first lateral wall, and the liquid can be quickly drawn into the individual housing parts. Also, because the gap dimension between the second extension part and the second lateral wall is larger than the gap dimension between the first extension part and the first lateral wall, surface tension does not readily occur in the gap between the second extension part and the second lateral wall, thus enabling liquid drawn into the individual housing parts to be inhibited from traveling along the second extension part and reaching the wire connection part side.

A configuration may be adopted in which the terminal connection part and the wire connection part are disposed in line with each other, and the housing part has a liquid storage main body part extending in the direction in which the terminal connection part and the wire connection part are disposed in line with each other, and an auxiliary liquid storage part protruding from the liquid storage main body part in a direction intersecting an extension direction of the liquid storage main body part.

According to such a configuration, the region in which liquid that drops from the liquid draining parts is contained can be enlarged, thus enabling liquid collected in the housing part to be inhibited from traveling along the second extension part and reaching the wire connection part side. Problems arising with other devices and the like due to liquid reaching the wires can thereby be inhibited.

A configuration may be adopted in which a depth dimension of the auxiliary liquid storage part is set larger than a depth dimension of the liquid storage main body part.

According to such a configuration, the region in which liquid that drops from the liquid draining parts is contained can be enlarged. Also, liquid accumulated inside the auxiliary liquid storage part can be inhibited from reaching the liquid storage main body part in which the terminal is disposed. Liquid collected in the housing part can thereby be further inhibited from traveling along the second extension part and reaching the wire connection part side, and problems arising with other devices and the like due to liquid reaching the wires can be inhibited.

Advantageous Effects of Invention

According to the technology disclosed in this specification, liquid can be inhibited from reaching wires.

DESCRIPTION OF EMBODIMENTS

First Embodiment

A first embodiment of the technology disclosed is this specification will be described with reference to FIGS. 1 to 10.

Figure 1:
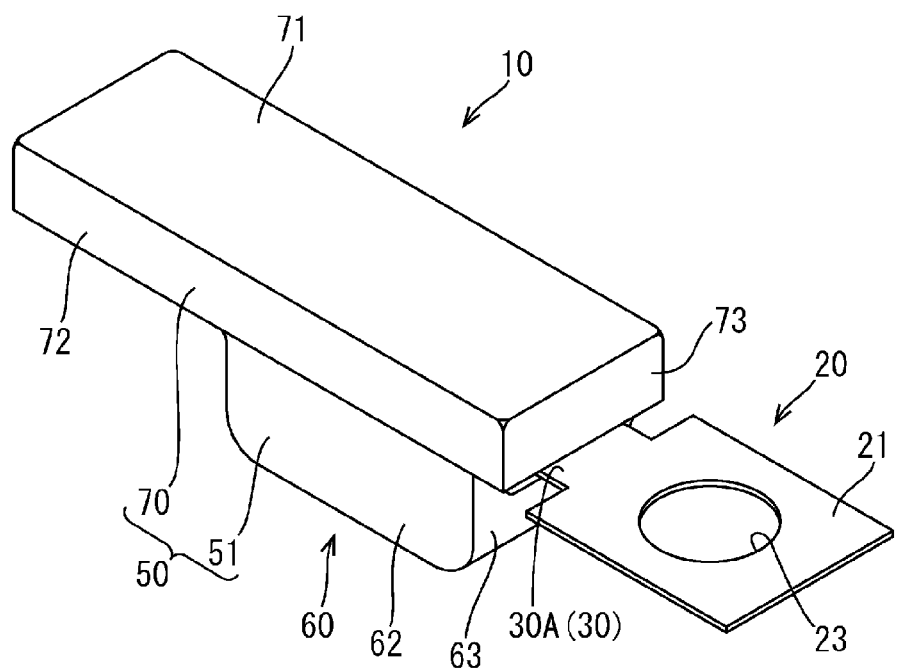
FIG. 1 is a perspective view of a terminal module according to a first embodiment.
Figure 1:
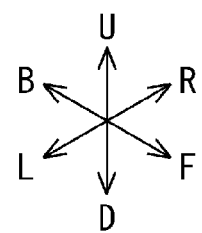
Figure 2:
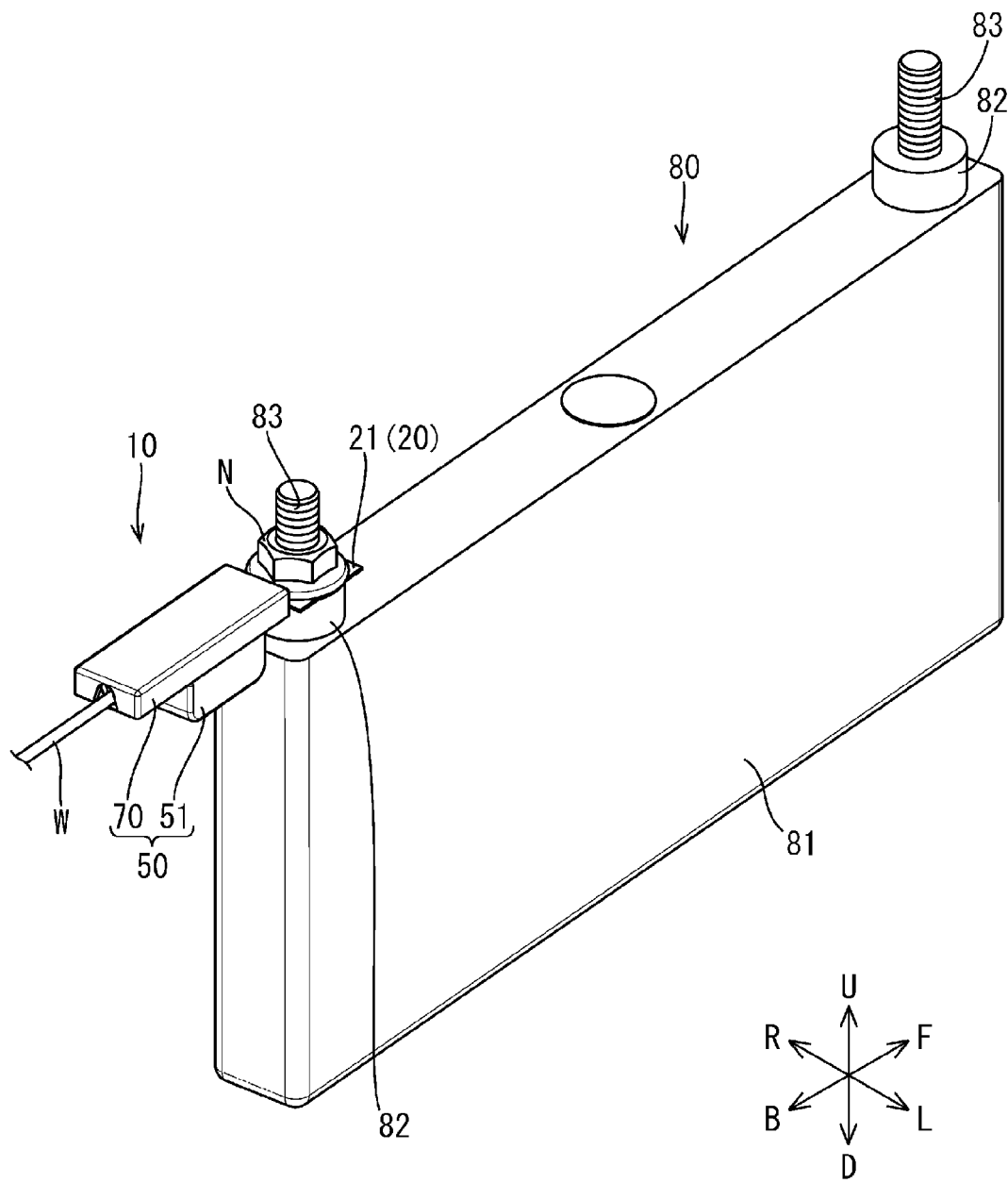
FIG. 2 is a perspective view showing a state where the terminal module is attached to a power storage device.
Figure 3:
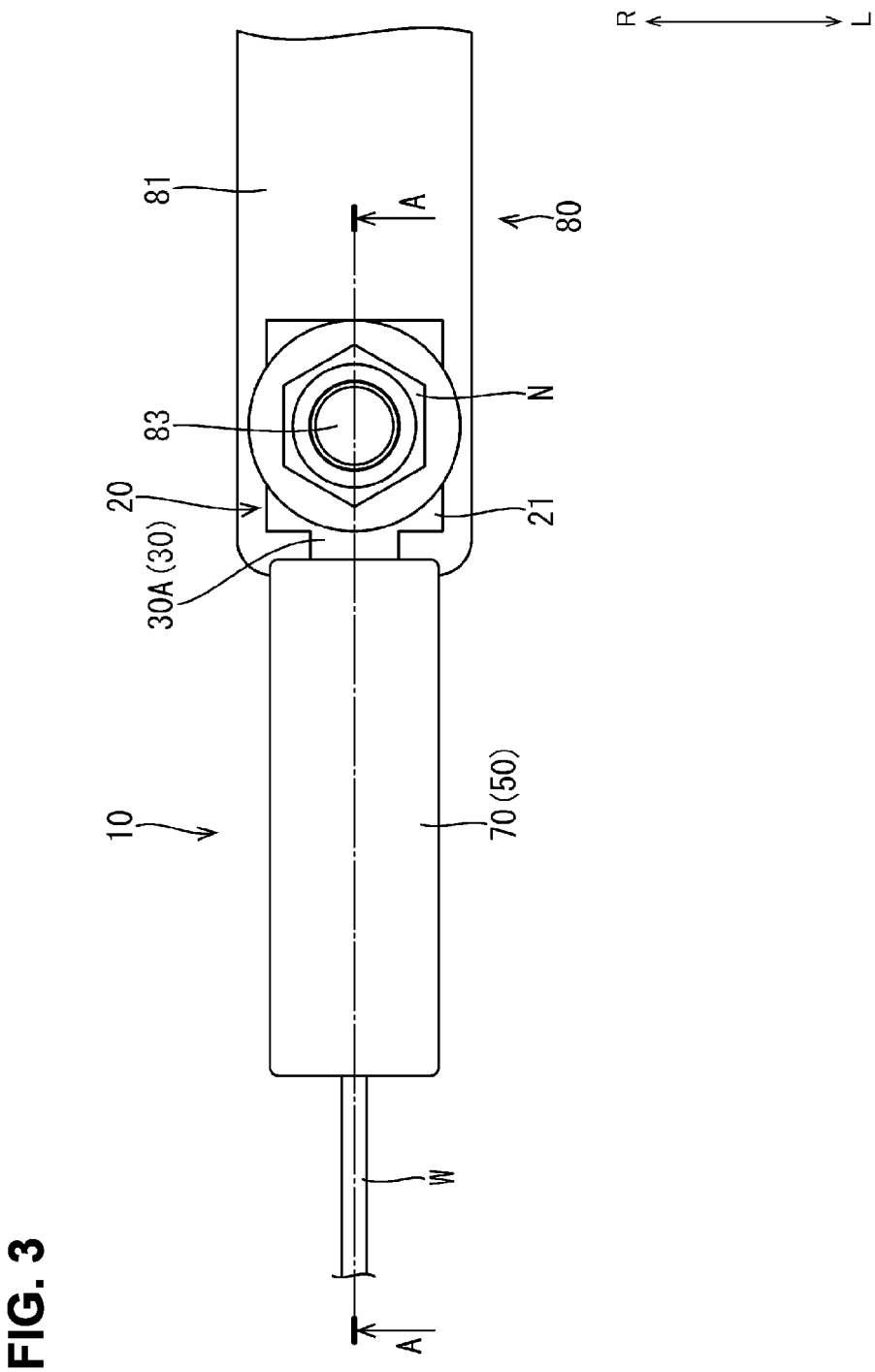
FIG. 3 is a plan view showing the state where the terminal module is attached to the power storage device.
Figure 4:
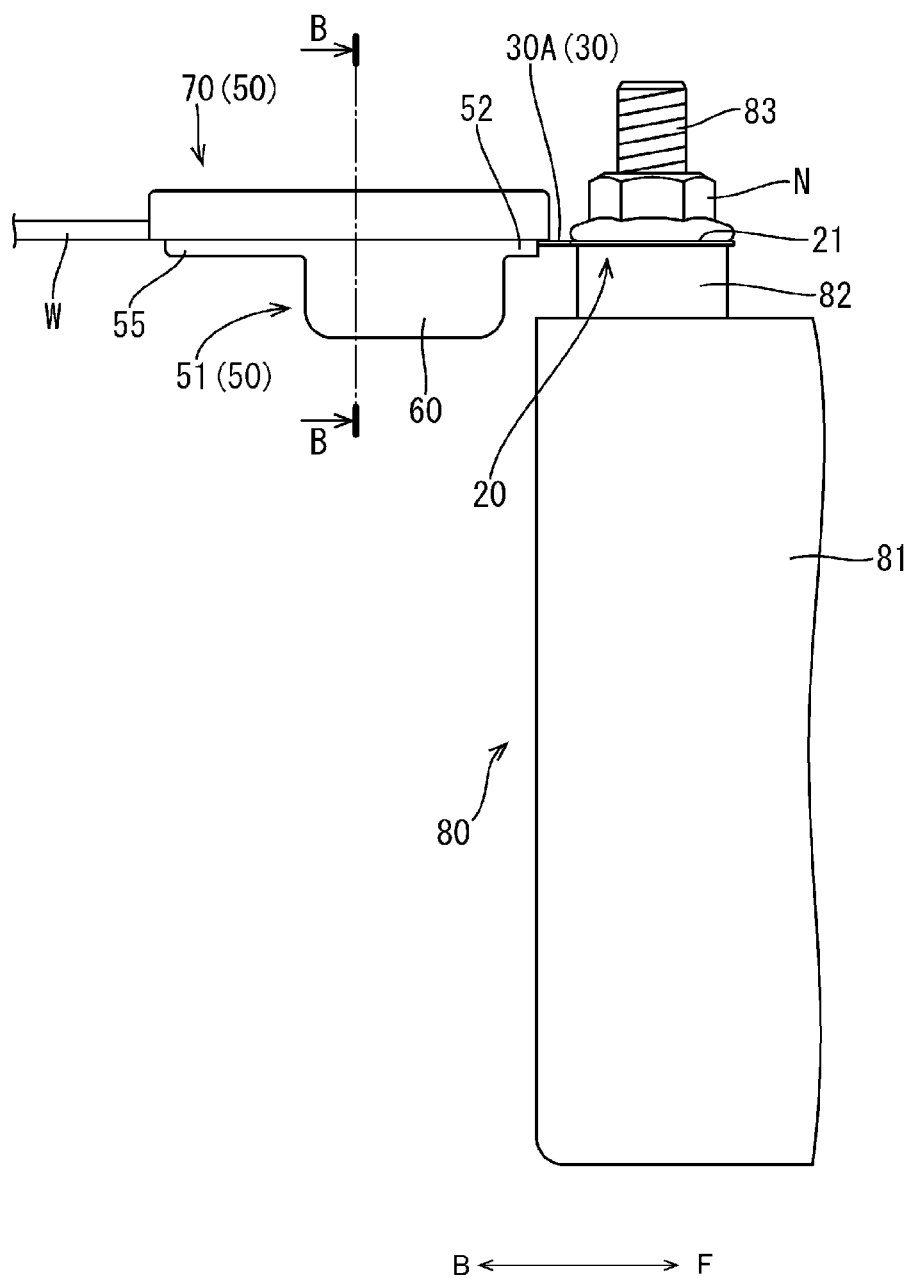
FIG. 4 is a side view showing the state where the terminal module is attached to the power storage device.

The present embodiment illustrates a terminal module 10 that is connected to a power storage device 80. Note that, in the following description, a U direction in FIGS. 1 and 2 is upward, a D direction is downward, an R direction is rightward, and an L direction is leftward. Also, the following description will be given with an F direction and a B direction in FIGS. 1 and 2 respectively as forward and backward.

As shown in FIGS. 2 to 5, the power storage device 80 has a device main body 81 having a flat approximately rectangular parallelepiped shape in which a power storage device, not illustrated, is housed. The device main body 81 has a pair of pedestal parts 82, one at either end part in the front-back direction, and a bolt-like electrode terminal 83 that protrudes upward from the pedestal parts 82 is provided on the upper surface of the pedestal parts 82. A voltage detection terminal 20, described later, of the terminal module 10 is connected to the electrode terminal 83. In order to connect the voltage detection terminal 20 to the electrode terminal 83, assembly is performed by inserting the electrode terminal 83 through the voltage detection terminal 20, and a nut N is tightened onto the electrode terminal 83. The electrode terminal 83 and the voltage detection terminal 20 are thus electrically connected by being sandwiched by the nut N and the pedestal part 82.

As shown in FIGS. 1 to 5, the terminal module 10 is constituted by being provided with the voltage detection terminal 20 for detecting the voltage of the power storage device 80 and a protector 50 that houses part of the voltage detection terminal 20.

The voltage detection terminal 20 is formed by machining a metal plate material having conductivity such as copper, copper alloy, aluminum, aluminum alloy and stainless steel (SUS), for example, with a press or the like.

Figure 7:
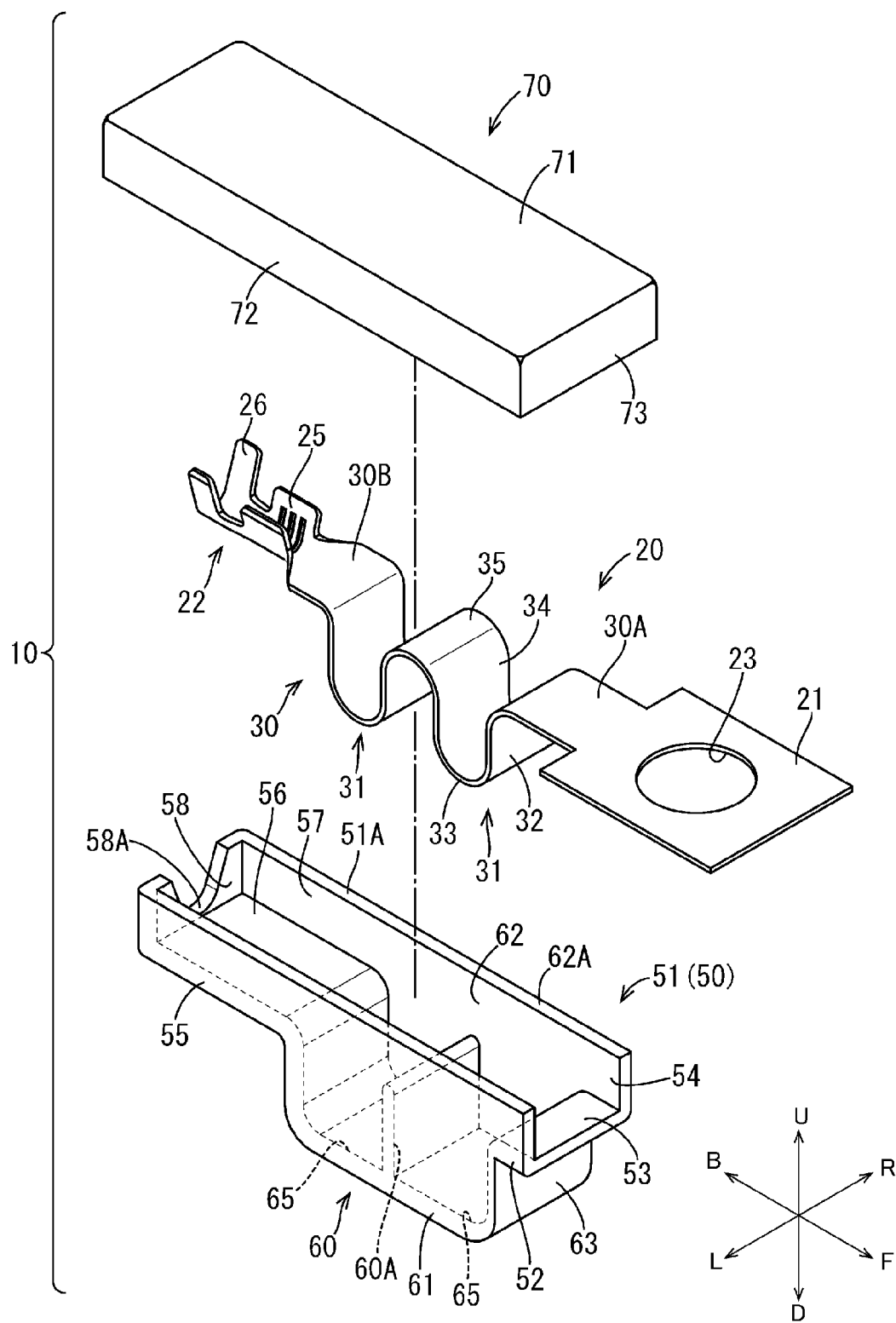
FIG. 7 is an exploded perspective view of the terminal module.
Figure 8:
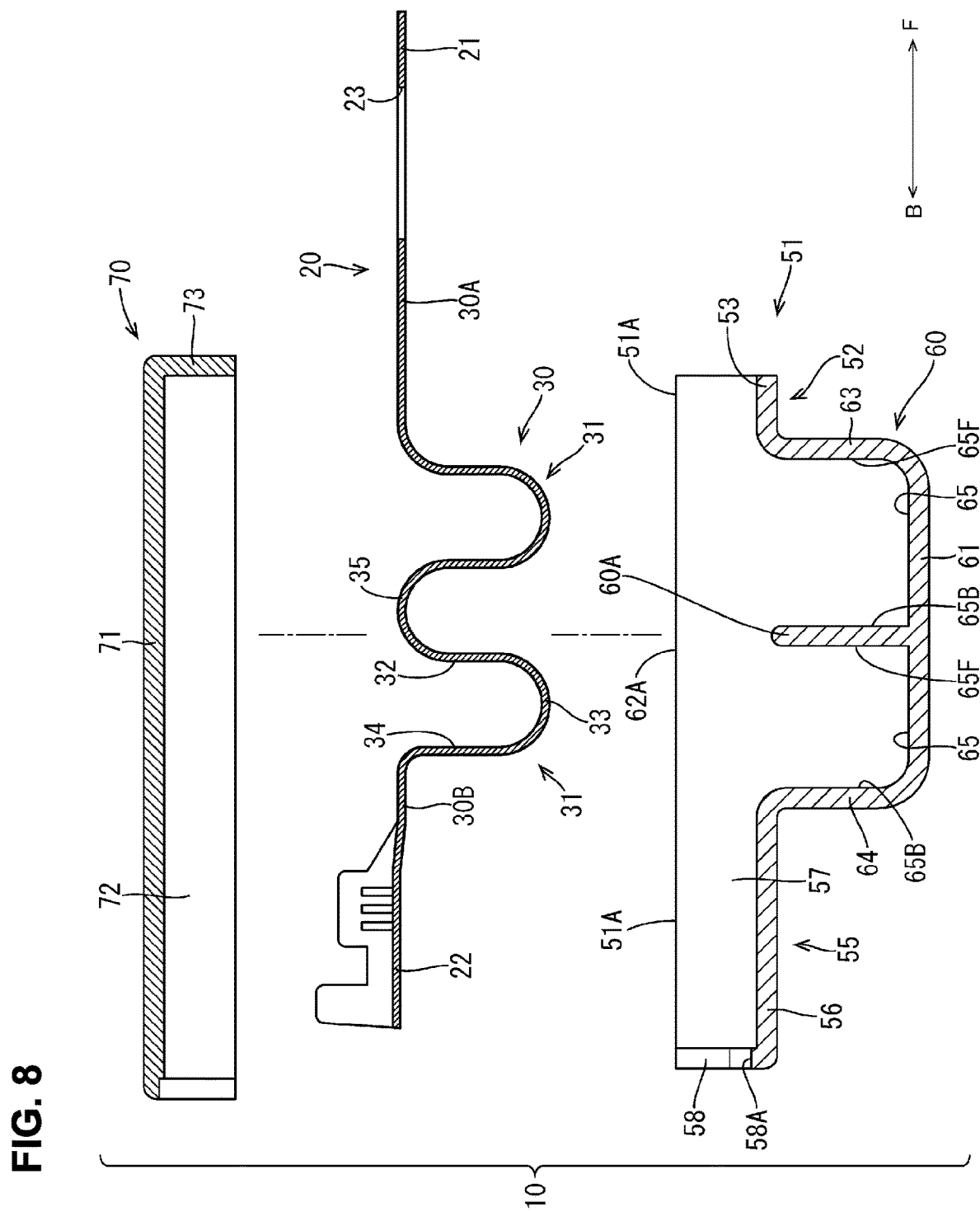
FIG. 8 is a sectional view corresponding to the sectional view of FIG. 5 in a state where the terminal module is broken down.
Figure 9:
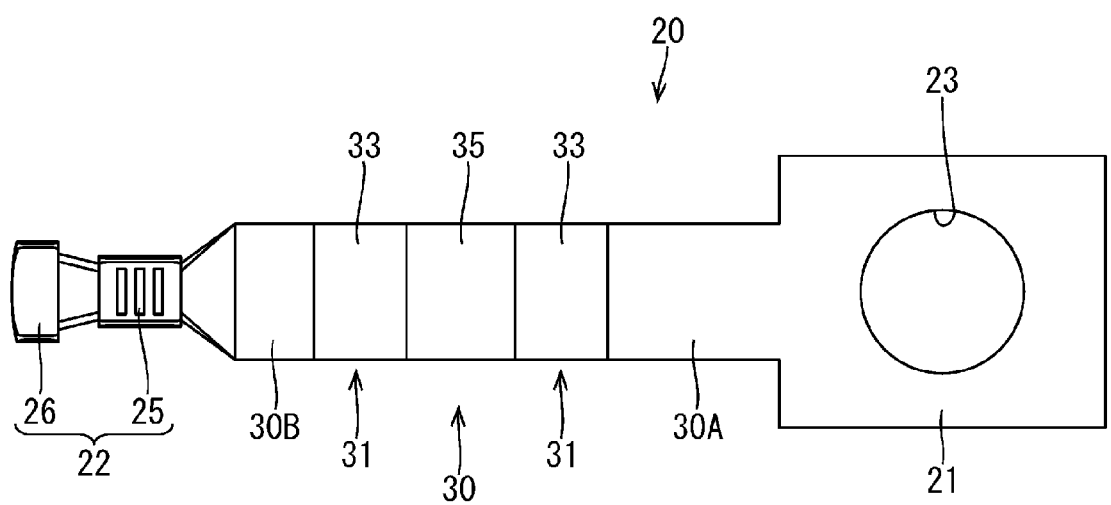
FIG. 9 is a plan view of a voltage detection terminal.

As shown in FIGS. 7 to 9, the voltage detection terminal 20 is constituted by being provided with a terminal connection part 21 that is connected to the electrode terminal 83 of the power storage device 80, a wire connection part 22 that is connected to the end of a wire W, and a joining part 30 that joins the terminal connection part 21 and the wire connection part 22 in the front-back direction.

The terminal connection part 21 has a flat approximately rectangular shape in plan view. An electrode insertion hole 23 passing through in the plate thickness direction is provided in the terminal connection part 21, and, by inserting the electrode terminal 83 of the power storage device 80 through the electrode insertion hole 23, the terminal connection part 21 can be assembled to the electrode terminal 83 and electrically connected.

The wire connection part 22 is disposed in line with and backward of the terminal connection part 21 and the joining part 30, and has a wire barrel 25 that is continuous backward of the joining part 30 and an insulation barrel 26 that is continuous backward of the wire barrel 25. The wire connection part 22 is connected to the end of the wire W, by the wire barrel 25 being crimped onto a core wire W1 exposed from an insulation coating W2 at the end of the wire W, and the insulation barrel 26 being crimped onto the insulation coating W2.

An end part of the wire W on the opposite side to the side that is connected to the voltage detection terminal 20 is connected to an ECU (Electronic Control Unit) not illustrated. The ECU has a microcomputer, an electronic device and the like installed therein, and has a known configuration provided with a function for performing processing such as detection of voltage, current, temperature and the like of the power storage device 80.

The joining part 30 is formed in a tabular shape of uniform width in the front-back direction, and is formed to join the terminal connection part 21 and the wire connection part 22 in the front-back direction, as a result of a front end part 30A of the joining part 30 being continuous with the back edge of the terminal connection part 21 and a back end part 30B being continuous with a front edge of the wire connection part 22.

The protector 50 is formed from an insulating synthetic resin. As shown in FIGS. 5 to 8 and FIG. 10, the protector 50 has a lower protector 51 in which the voltage detection terminal 20 is housed from above, and an upper protector 70 that is assembled to the lower protector 51 from above.

The lower protector 51 is formed in an approximately rectangular shape in plan view that is long from back to front, and has a first housing part 52 that houses the front end part 30A of the joining part 30, and a second housing part 55 that houses the back end part 30B of the joining part 30 and the wire connection part 22 of the voltage detection terminal 20.

The first housing part 52 is constituted by being provided with a first placement wall 53 that is approximately rectangular in plan view and a pair of first lateral walls 54 that stand one on either side edge of the first placement wall 53 in the left-right direction, and is formed to be open in the front-back direction and upward.

The front end part 30A of the joining part 30 that extends directly backward from the back edge of the terminal connection part 21 can be placed on the first placement wall 53 from above, and the length dimension of the first placement wall 53 in the left-right direction is set slightly larger than the length dimension of the joining part 30 in the left-right direction.

The second housing part 55 is constituted by being provided with a second placement wall 56 having an approximately rectangular shape in plan view, a pair of second lateral walls 57 that stand one on either side edge of the second placement wall 56 in the left-right direction, and a second back wall 58 provided to be continuous with the back end edge of the second placement wall 56 and the back end edge of the pair of second lateral walls 57, and is formed to be open forward and upward.

The wire connection part 22 and the back end part 30B of the joining part 30 that extends directly forward from the front edge of the wire connection part 22 can be placed on the second placement wall 56, and the height position of the second placement wall 56 in the up-down direction is substantially the same height position of the first placement wall 53. Note that substantially the same height includes the case where the heights of the second placement wall 56 and the first placement wall 53 are the same, and also the case where the heights of the second placement wall 56 and the first placement wall 53 are recognized as being approximately the same even if they differ.

In the second back wall 58, a wire lead hole 58A that leads the wire W connected to the wire connection part 22 is formed to be recessed downward from the upper end of the second back wall 58. When the back end part 30B of the joining part 30 and the wire connection part 22 are placed on the second placement wall 56, the wire W is inserted through the wire lead hole 58A, and the wire W is led backward from the wire lead hole 58A.

Figure 6:
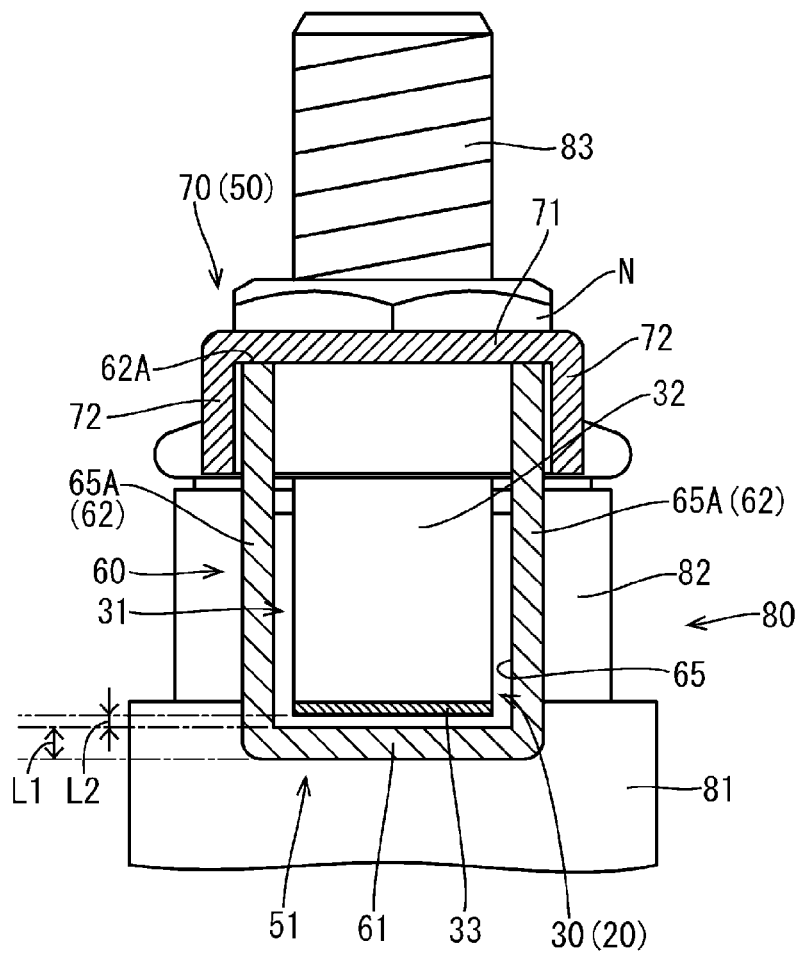
FIG. 6 is a sectional view taken along line B-B in FIG. 4.

As shown in FIGS. 6 and 7, the upper protector 70 is constituted by being provided with a ceiling wall 71 having an approximately rectangular shape in plan view, a pair of upper lateral walls 72 that extend downward one from either end edge of the ceiling wall 71 in the left-right direction, and an upper front wall 73 that extends downward from the front end edge of the ceiling wall 71. The upper protector 70 is formed to be slightly larger than the lower protector 51 in the front-back and right-left directions, and when the upper protector 70 is assembled to the lower protector 51, the lower protector 51 is completely covered from above together with the joining part 30 and the wire connection part 22 of the voltage detection terminal 20.

Figure 5:
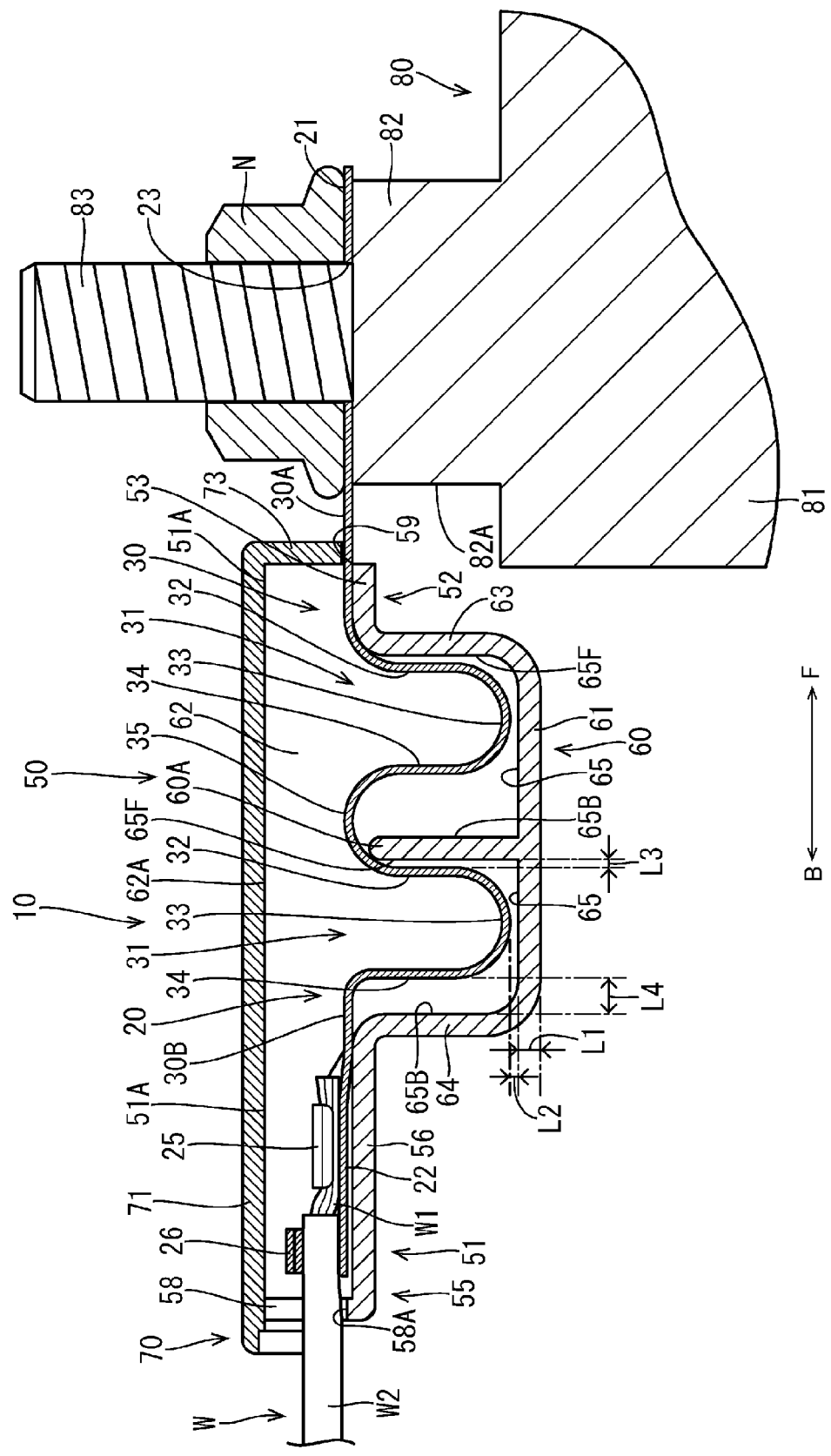
FIG. 5 is a sectional view taken along line A-A in FIG. 3.

The extension dimension (length dimension in the up-down direction) of the upper front wall 73 from the ceiling wall 71 is set slightly shorter than the height dimension of the first housing part 52 of the lower protector 51, and in a state where the upper protector 70 is assembled to the lower protector 51, an insertion opening 59 through which the front end part 30A of the joining part 30 is inserted is formed between the upper front wall 73 and the first placement wall 53 of the first housing part 52, as shown in FIG. 5.

The joining part 30 in the voltage detection terminal 20 has a plurality of liquid draining parts 31, and the lower protector 51 of the protector 50 has a housing part 60 that houses the plurality of liquid draining parts 31 between the first housing part 52 and the second housing part 55.

As shown in FIGS. 7 to 9, two liquid draining parts 31 are continuous in the front-back direction so as to join the front end part 30A of the joining part 30 and the back end part 30B of the joining part 30 in the front-back direction.

Each liquid draining part 31 is formed to have the same width dimension as the front end part 30A and the back end part 30B of the joining part 30, and has a first extension part 32 that bends downward from the front end part 30A and extends downward in the direction of gravity, a bent part 33 that bends back in a circular arc backward from the lower end edge of the first extension part 32, and a second extension part 34 that extends upward in the opposite direction to the direction of gravity from the upper end edge on the back side of the bent part 33.

In other words, the first extension part 32 and the second extension part 34 are in a state of facing each other in the front-back direction, and the bent part 33 joins the lower end edge which is the extension end part of the first extension part 32 and the lower end edge which is the base end part of the second extension part 34 in a bent state.

Also, in the portion of the liquid draining parts 31 that is continuous in the front-back direction, the back end edge which is the leading end part of the second extension part 34 in the liquid draining part 31 on the front side and the upper end edge which is the base end part of the first extension part 32 in the liquid draining part 31 on the back side are coupled by a coupling part 35 bent in a circular arc, and the upper end position which is the highest point of the coupling part 35 is set to substantially the same height position as the front end part 30A and the back end part 30B of the joining part 30.

Also, in a state where the terminal connection part 21 is connected to the electrode terminal 83 of the power storage device 80, as shown in FIG. 5, the first extension part 32 and the second extension part 34 are disposed in a state of extending downward along a lateral surface 82A of the pedestal part 82 of the device main body 81 backward (laterally) of the pedestal part 82.

Accordingly, each liquid draining part 31 in the joining part 30 is formed to snake up and down along the lateral surface 82A of the pedestal part 82 of the device main body 81 in a state of being disposed further downward in the direction of gravity than the height position of the front end part 30A and the back end part 30B of the joining part 30.

Figure 10:
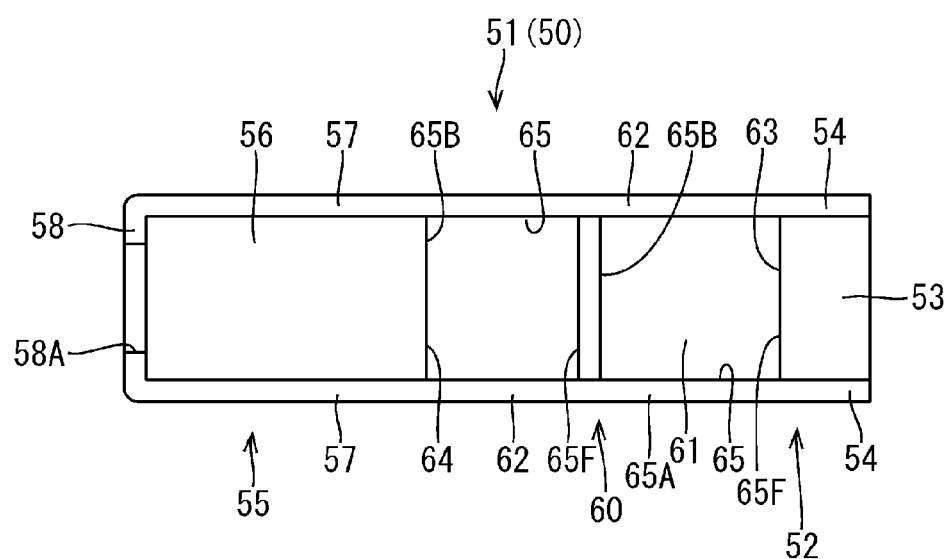
FIG. 10 is a plan view of a lower protector.
Figure 10:
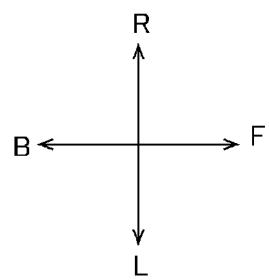

On the other hand, as shown in FIGS. 7, 8 and 10, the housing part 60 is formed in a box shape larger than the first housing part 52 and the second housing part 55 in the up-down direction, and the housing part 60 has a bottom wall 61 having an approximately rectangular shape in plan view and the same width dimension as the width dimension of the first housing part 52 and the second housing part 55 in the left-right direction.

As shown in FIG. 6, a pair of lateral walls 62 stand one on either side edge of the bottom wall 61 in the left-right direction, and an upper end surface 62A of the pair of lateral walls 62 is in a state of being flush with an upper end surface 51A of the first housing part 52 and the second housing part 55.

Accordingly, the housing part 60 is formed to protrude further downward than the first housing part 52 and the second housing part 55, and the housing part 60 is disposed backward (laterally) of the device main body 81, similarly to the liquid draining parts 31 of the voltage detection terminal 20.

A front wall 63 of the housing part 60 extends downward from the back end edge of the first placement wall 53 of the first housing part 52 and is continuous with the front end edge of the bottom wall 61, and a back wall 64 of the housing part 60 extends downward from the front end edge of the second placement wall 56 of the second housing part 55 and is continuous with the back end edge of the bottom wall 61. Also, the pair of lateral walls 62 of the housing part 60 are continuous in a flush manner in the front-back direction with the first lateral walls 54 of the first housing part 52 and the second lateral walls 57 of the second housing part 55.

The inside of the housing part 60 is divided into a plurality of individual housing parts 65 that individually house the plurality of liquid draining parts 31.

The plurality of individual housing parts 65 are disposed in line with each other so as to be continuous in the front-back direction. The individual housing parts 65 that are adjacent front and back are formed by dividing the pair of lateral walls 62 of the housing part 60 with a partition wall 60A that extends in the left-right direction, and the partition wall 60A dividing the individual housing parts 65 that are adjacent front and back constitutes a back wall 65B of the individual housing part 65 arranged on the front side, and constitutes a front wall 65F of the individual housing part 65 arranged on the back side.

Also, the front wall 65F of the frontmost individual housing part 65 of the plurality of individual housing parts 65 constitutes the front wall 63 of the housing part 60, and the back wall 65B of the backmost individual housing part 65 constitutes the back wall 64 of the housing part 60. Lateral walls 65A on both left and right sides of the individual housing parts 65 adjacent front and back constitute the lateral walls 62 on both left and right sides of the housing part 60, by being continuous in the front-back direction.

Also, in a state where the liquid draining parts 31 in the joining part 30 are individually housed in the individual housing parts 65, the bottom wall 61 of the housing part 60 and the bent part 33 of the liquid draining parts 31 face each other in the up-down direction with a gap dimension L2 therebetween that is smaller than a thickness dimension L1 of the bottom wall 61, as shown in FIGS. 5 and 6. Also, as shown in FIG. 5, the front wall 65F of the individual housing parts 65 and the first extension part 32 of the liquid draining parts 31 face each other in the front-back direction, and the back wall 65B of the individual housing parts 65 and the second extension part 34 of the liquid draining parts 31 face each other in the front-back direction, in which state the first extension part 32 and the second extension part 34 are disposed in the individual housing parts 65 such that a gap dimension L3 between the front wall 65F of the individual housing parts 65 and the first extension part 32 is smaller than a gap dimension L4 between the back wall 65B of the individual housing part 65 and the second extension part 34.

The present embodiment is configured as described above, and, next, the operation and effect of the terminal module 10 will be described.

Generally, liquid such as water droplets may adhere to an electrode terminal or the like to which a terminal module is connected. For example, when the temperature of the electrode terminal drops, liquid adheres to the electrode terminal due to condensation occurring on the electrode terminal. There is concern that if liquid adhering to the electrode terminal reaches the wires via the voltage detection terminal, the liquid will infiltrate the voltage detector or ECU through the wires and cause problems.

In view of this, the inventors discovered the configuration of the present embodiment, as a result of conducting diligent research, in order to solve the above problem. That is, the terminal module 10 of the present embodiment is provided with the voltage detection terminal 20 having the terminal connection part 21 that is connected to the electrode terminal 83 and the wire connection part 22 that is connected to the wire W, and the protector 50 that houses at least part of the voltage detection terminal 20, with at least one liquid draining part 31 including the first extension part 32 extending downward in the direction of gravity being provided between the terminal connection part 21 and the wire connection part 22 in the voltage detection terminal 20, and the protector 50 having the housing part 60 that houses the liquid draining part 31 and accumulates liquid that travels along the first extension part 32.

That is, according to the terminal module 10 of the present embodiment, liquid adhering to the electrode terminal 83 travels along the first extension part 32 of the liquid draining part 31 from the terminal connection part 21, drops from the lower end part of the first extension part 32, and is accumulated in the housing part 60. Liquid can thereby be inhibited from reaching the wire connection part 22.

Hence, liquid can be inhibited from traveling along the wire W and infiltrating other devices and the like and causing problems.

Also, according to the present embodiment, the liquid draining part 31 further has the second extension part 34 extending upward in the opposite direction to downward in the direction of gravity, and the bent part 33 that joins the lower end edge which is the extension end edge of the first extension part 32 and the lower end edge which is the base end part of the second extension part 34 in a bent state, and the housing part 60 has the bottom wall 61 that faces the bent part 33 with a gap to the bent part 33.

In other words, liquid that travels along the first extension part 32 is pulled by surface tension into the gap between the bent part 33 of the liquid draining part 31 and the bottom wall 61 of the housing part 60, and the liquid readily collects in the housing part 60, thus enabling liquid to be further inhibited from reaching the wire connection part 22.

Also, the electrode terminal 83 of the present embodiment is provided in the device main body 81 of the power storage device 80, and the first extension part 32 extends along the lateral surface 82A of the pedestal part 82 in the device main body 81, thus enabling the length dimension of the first extension part 32 to be set larger, compared with the case where the first extension part is disposed on the upper part of the device main body, for example. In other words, liquid can be guided by the first extension part 32 to a position away from the wire connection part 22, thus enabling liquid to be further inhibited from reaching the wire connection part 22.

Furthermore, the housing part 60 is disposed backward (laterally) of the device main body 81, thus enabling the overall height dimension of the power storage device 80 to which the terminal module 10 is attached to be inhibited from becoming larger, compared with the case where the housing part is disposed on an upper part of the device main body of the power storage device, for example. In other words, this configuration is very effective in the case where there is a restriction on the height dimension in the space where the power storage device 80 is disposed.

Also, in the present embodiment, a plurality of liquid draining parts 31 are provided between the terminal connection part 21 and the wire connection part 22, thus enabling liquid to be inhibited from reaching the wire connection part 22.

Incidentally, in the case where a plurality of liquid draining parts are collectively housed in one housing part, for example, there is concern that liquid that drops into the housing part from the liquid draining part nearest the terminal connection part will travel along the bottom wall and reach the wire connection part from the liquid draining part nearest the wire connection part.

However, the housing part 60 of the present embodiment has the individual housing parts 65 individually housing the plurality of liquid draining parts 31, thus enabling liquid that drops from each liquid draining part 31 to be prevented from traveling along the bottom wall 61 and reaching other liquid draining parts 31.

Furthermore, the individual housing parts 65 of the present embodiment have the front wall (first lateral wall) 65F extending along the first extension part 32 and the back wall (second lateral wall) 65B extending along the second extension part 34, and the gap dimension L3 between the first extension part 32 and the front wall 65F is set smaller than the gap dimension L4 between the second extension part 34 and the back wall 65B.

In other words, liquid adhering to the liquid draining part 31 is pulled by surface tension into the gap between the first extension part 32 and the front wall 65F, enabling the liquid to be quickly drawn into the individual housing part 65. On the other hand, the gap dimension L4 between the second extension part 34 and the back wall 65B is larger than the gap dimension L3 between the first extension part 32 and the front wall 65F, thus enabling liquid pulled into the individual housing parts 65 to be inhibited from traveling along the second extension part 34 and reaching the wire connection part 22 side.

Second Embodiment

Next, a second embodiment will be described with reference to FIGS. 11 to 15.

In a protector 150 of the second embodiment, the width dimension of the housing part 60 of the protector 50 in the first embodiment in the left-right direction is changed, and since the configuration, operation and effect are in common with the first embodiment, description thereof will be omitted. Also, the same reference signs will be used for configuration that is the same as the first embodiment.

A housing part 160 of a lower protector 151 of the second embodiment has a liquid storage main body part 166 that extends in the direction in which the terminal connection part 21 and the wire connection part 22 are disposed in line with each other, and a pair of auxiliary liquid storage parts 167 that protrude from the liquid storage main body part 166 in an orthogonal direction which is a direction intersecting the extension direction of the liquid storage main body part 166.

Also, an upper protector 170 is formed such that an approximately central part in the back-front direction protrudes in the left-right direction in conformity with the housing part 160.

Figure 13:
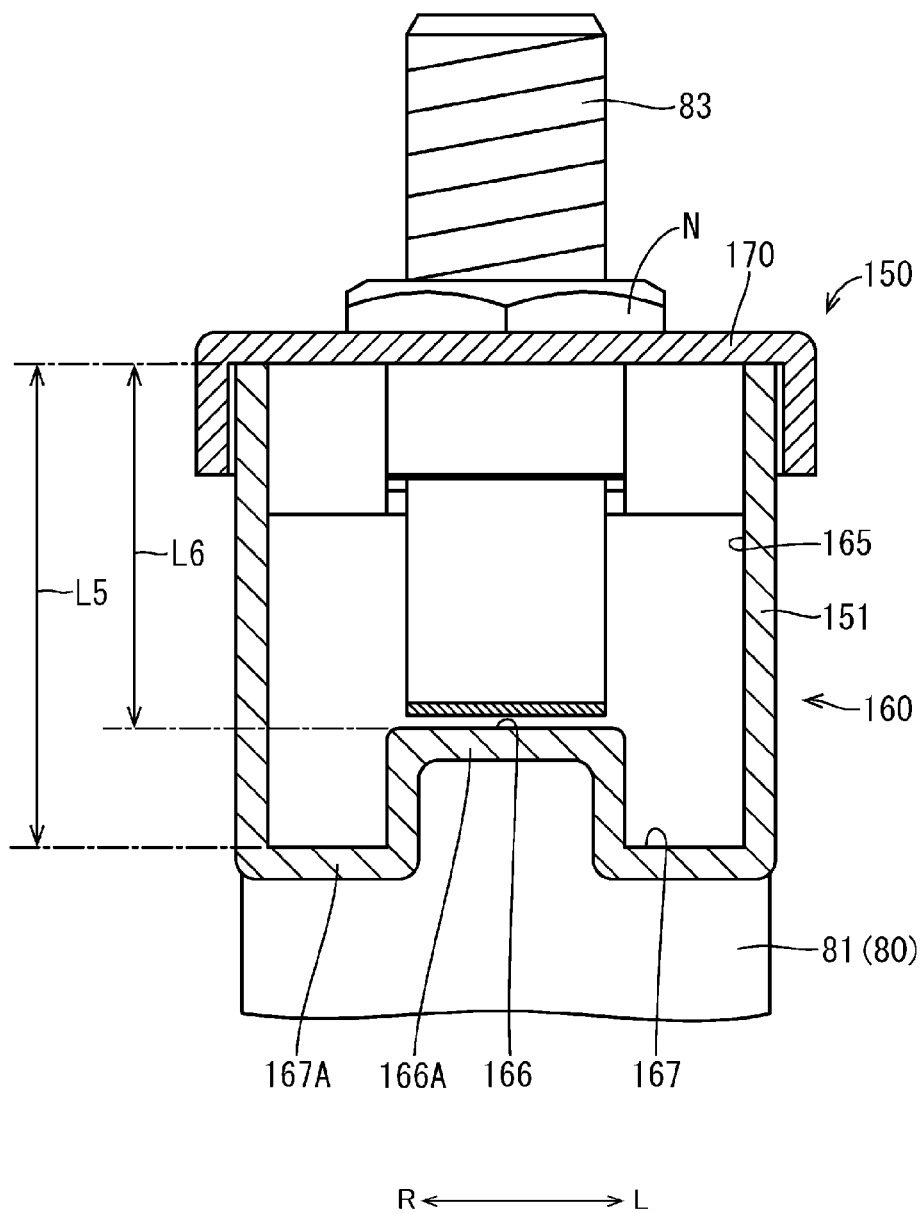
FIG. 13 is a sectional view of the terminal module corresponding to the sectional view of FIG. 6.
Figure 14:
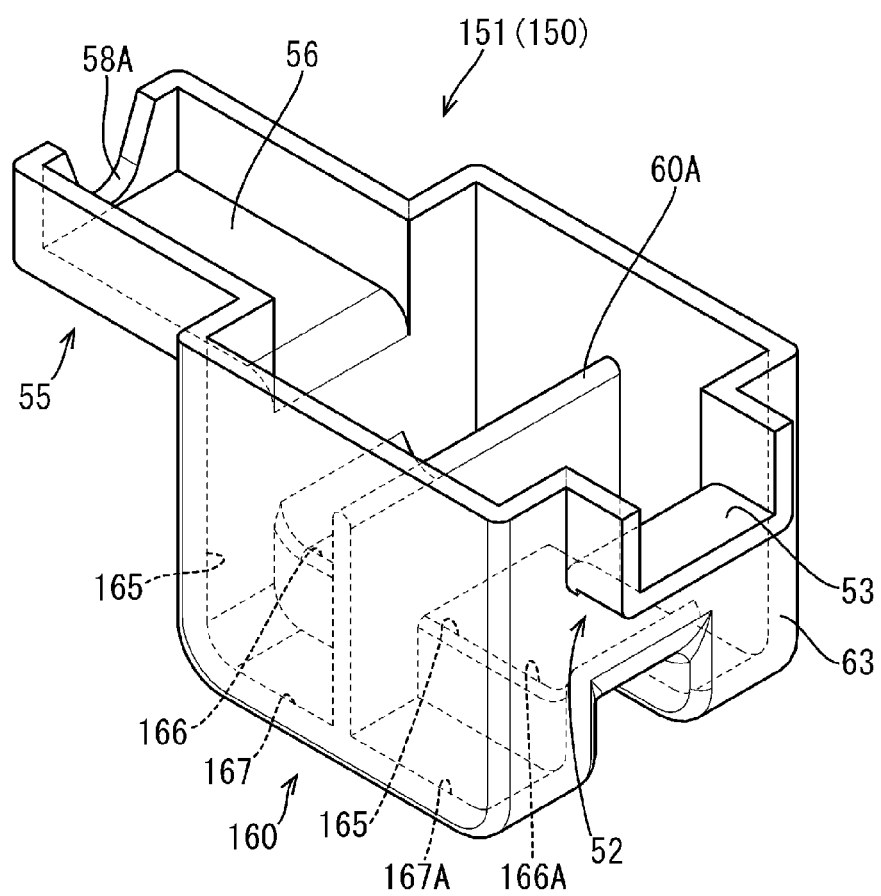
FIG. 14 is a perspective view of a lower protector according to the second embodiment.
Figure 14:
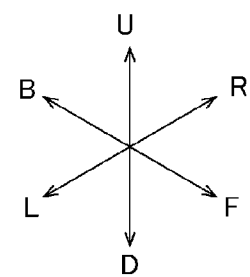
Figure 15:
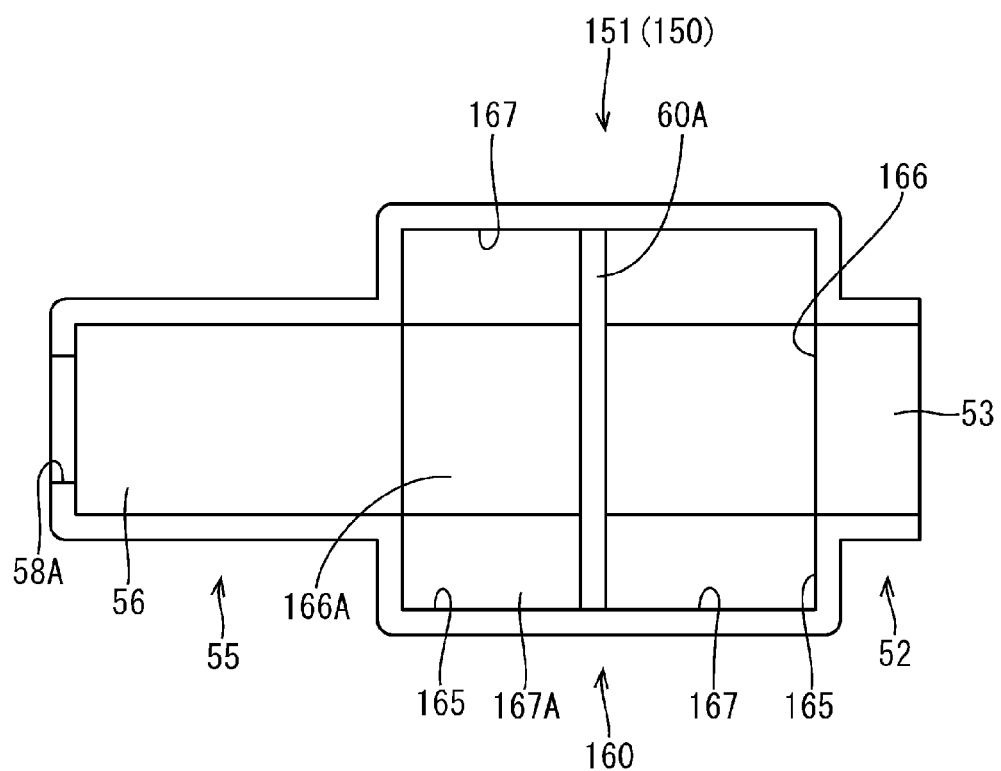
FIG. 15 is a plan view of the lower protector.
Figure 15:
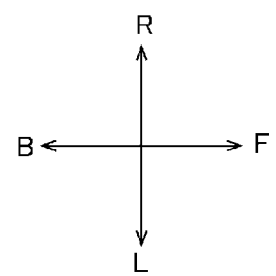

As shown in FIGS. 13 to 15, the liquid storage main body part 166 is set to substantially the same width dimension as the width dimension of the first housing part 52 and the second housing part 55 in the left-right direction. Accordingly, the auxiliary liquid storage parts 167 are formed to protrude further in the left-right direction than the first housing part 52 and the second housing part 55.

Figure 11:
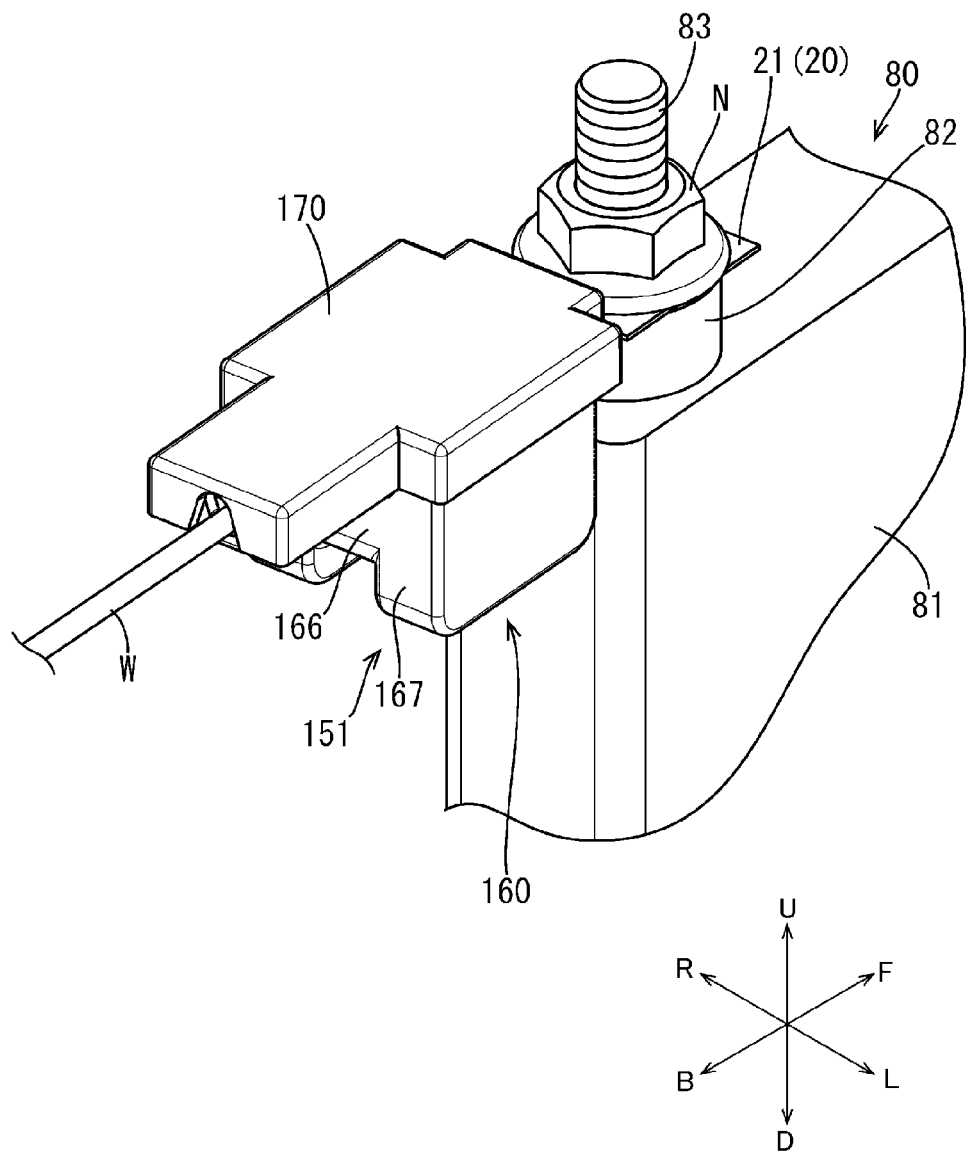
FIG. 11 is a perspective view showing a state where a terminal module according to a second embodiment is attached to a power storage device.
Figure 12:
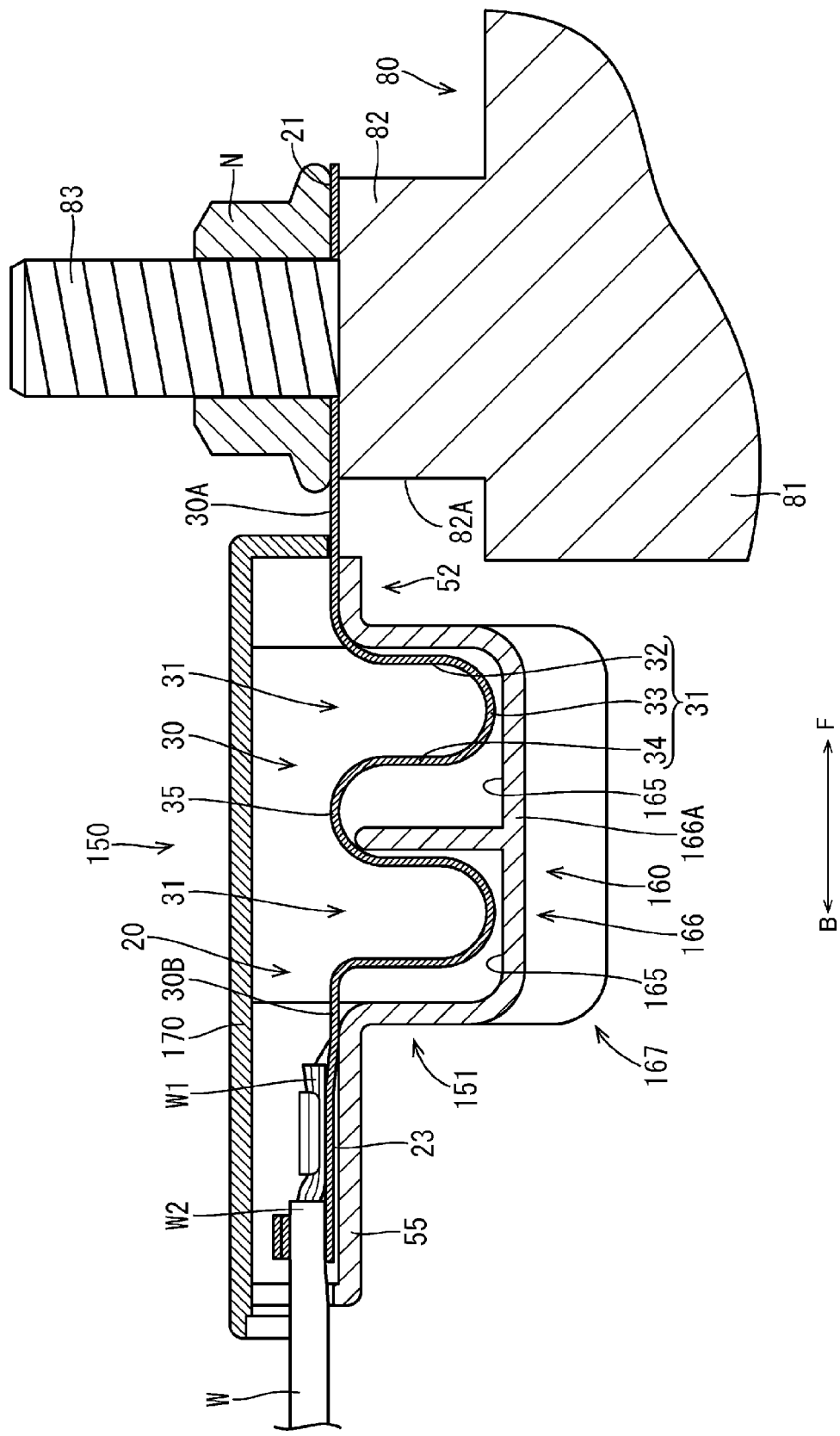
FIG. 12 is a sectional view of the terminal module corresponding to the sectional view of FIG. 5.

Also, as shown in FIGS. 11, 13 and 14, the auxiliary liquid storage parts 167 protrude further downward than the liquid storage main body part 166, and a bottom wall 167A of the auxiliary liquid storage parts 167 is set to a position one step lower down than the bottom wall 166A of the liquid storage main body part 166. Accordingly, a depth dimension L5 of the auxiliary liquid storage parts 167 in the up-down direction is set larger than a depth dimension L6 of the liquid storage main body part 166 in the up-down direction.

In other words, the internal space of the housing part 160 of the present embodiment and, hence, the individual housing parts 165, is large compared with the case where the auxiliary liquid storage parts are not provided.

That is, according to the present embodiment, the housing part 160 has the auxiliary liquid storage parts 167 that protrude further in the left-right direction and up-down direction than the liquid storage main body part 166, thus enabling a large amount of liquid that travels along the first extension part 32 and drops down to be accumulated in the housing part 160, and liquid to be further inhibited from traveling along the second extension part 34 and reaching the wire connection part 22 side, compared with the case where the auxiliary liquid storage parts are not provided.

OTHER EMBODIMENTS

The technology disclosed in this specification is not limited to the embodiments illustrated with the above description and drawings, and various modes such as the following, for example, are also included.

(1) In the above embodiments, a configuration was adopted in which the terminal connection part 21 of the voltage detection terminal 20 and the electrode terminal 83 are fastened by the nut N and the pedestal part 82. However, the disclosure is not limited thereto, and a configuration may be adopted in which the terminal connection part is connected to the electrode terminal by laser welding, ultrasonic welding, resistance welding or the like.

(2) In the above embodiments, the voltage detection terminal 20 that is connected to the electrode terminal 83 is shown as an example. However, the disclosure is not limited thereto, and the technology disclosed in this specification may be applied to a bus bar terminal that connects the electrode terminals of adjacent power storage devices.

(3) In the above embodiments, a configuration was adopted in which the voltage detection terminal 20 is connected to the electrode terminal 83 of the power storage device 80. However, the disclosure is not limited thereto, and a configuration may be adopted in which the voltage detection terminal is connected to an electrode terminal of a capacitor or the like.

(4) In the above embodiments, the liquid adhering to the electrode terminal 83 was given as water droplets. However, the disclosure is not limited thereto, and the liquid adhering to the electrode terminal may be liquid other than water droplets such as electrolyte.

(5) In the above embodiments, a configuration was adopted in which liquid that runs down the liquid draining parts 31 is accumulated in the housing part 60 or 160. However, the disclosure is not limited thereto, and a discharge hole for guiding liquid that runs down the liquid draining parts to a safe external region may be provided in the housing part.

LIST OF REFERENCE NUMERALS

10: Terminal module
20: Voltage detection terminal (example of "terminal")
21: Terminal connection part
22: Wire connection part
32: First extension part
31: Liquid draining part
33: Bent part
34: Second extension part
50: Protector
60: Housing part
61: Bottom wall
65: Individual housing part
65B: Back wall (example of "second lateral wall")
65F: Front wall (an example of "first lateral wall")
80: Power storage device
81: Device main body
83: Electrode terminal
166: Liquid storage main body part
167: Auxiliary liquid storage part
L2: Gap
L3: Gap dimension between first extension part and first lateral wall
L4: Gap dimension between second extension part and second lateral wall
W: Wire

The invention claimed is:

1. A terminal module comprising:
a voltage detection terminal including a terminal connection part configured to be connected to an electrode terminal and a wire connection part configured to be connected to a wire; and
a protector that houses at least part of the voltage detection terminal,
wherein at least one liquid draining part including a first extension part extending in a direction of gravity is provided between the terminal connection part and the wire connection part in the voltage detection terminal,
the protector includes a housing part that houses the at least one liquid draining part,
the voltage detection terminal further includes a front end part between the terminal connection part and the at least one liquid draining part, and a back end part between the wire connection part and the at least one liquid draining part,
the protector further includes a first housing part that houses the front end part and a second housing part that houses the back end part,
the first housing part includes a first placement wall on which the front end part is placed such that a lower surface of the front end part contacts an upper surface of the first placement wall,
the second housing part includes a second placement wall on which the back end part is placed such that a lower surface of the back end part contacts an upper surface of the second placement wall, and
the housing part is deeper than the first housing part and the second housing part.

2. The terminal module according to claim 1,
wherein the electrode terminal is provided in a device main body of a power storage device, and the first extension part extends along a lateral surface of the device main body.

3. The terminal module according to claim 1,
wherein the electrode terminal is provided in a device main body of a power storage device, and
the housing part is disposed laterally to the device main body.

4. The terminal module according to claim 1,
wherein the liquid draining part further has a second extension part extending in an opposite direction to the direction of gravity, and a bent part joining an extension end of the first extension part and a base end of the second extension part in a bent state, and
the housing part has a bottom wall facing the bent part with a gap to the bent part.

5. The terminal module according to claim 4,
wherein the at least one liquid draining part includes a plurality of liquid draining parts provided between the terminal connection part and the wire connection part, and
the housing part includes individual housing parts individually housing the plurality of liquid draining parts.

6. A terminal module comprising:
a voltage detection terminal including a terminal connection part configured to be connected to an electrode terminal and a wire connection part configured to be connected to a wire; and
a protector that houses at least part of the voltage detection terminal,
wherein at least one liquid draining part including a first extension part extending in a direction of gravity is provided between the terminal connection part and the wire connection part in the voltage detection terminal, and
the protector includes a housing part that houses the at least one liquid draining part,
wherein the liquid draining part further includes a second extension part extending in an opposite direction to the direction of gravity, and a bent part joining an extension end of the first extension part and a base end of the second extension part in a bent state, and
the housing part includes a bottom wall facing the bent part, wherein the housing part includes a first lateral wall extending along the first extension part and a second lateral wall extending along the second extension part, and a gap dimension between the first extension part and the first lateral wall is smaller than a gap dimension between the second extension part and the second lateral wall.

7. The terminal module according to claim 6, wherein the bottom wall faces the bent part with a gap to the bent part.

8. The terminal module according to claim 6, wherein the at least one liquid draining part includes a plurality of liquid draining parts provided between the terminal connection part and the wire connection part, the housing part includes individual housing parts individually housing the plurality of liquid draining parts, wherein the individual housing parts include the first lateral wall extending along the first extension part and the second lateral wall extending along the second extension part, and the gap dimension between the first extension part and the first lateral wall is smaller than the gap dimension between the second extension part and the second lateral wall.

9. The terminal module according to claim 8, wherein the bottom wall faces the bent part with a gap to the bent part.

10. A terminal module comprising:

a voltage detection terminal including a terminal connection part configured to be connected to an electrode terminal and a wire connection part configured to be connected to a wire; and a protector that houses at least part of the voltage detection terminal, wherein at least one liquid draining part including a first extension part extending in a direction of gravity is provided between the terminal connection part and the wire connection part in the voltage detection terminal, and the protector includes a housing part that houses the liquid draining part, wherein the terminal connection part and the wire connection part are disposed in line with each other, and the housing part includes a liquid storage main body part extending in a direction in which the terminal connection part and the wire connection part are disposed in line with each other, and an auxiliary liquid storage part protruding from the liquid storage main body part in a direction intersecting an extension direction of the liquid storage main body part.

11. The terminal module according to claim 10, wherein a depth dimension of the auxiliary liquid storage part is larger than a depth dimension of the liquid storage main body part.

\* \* \* \* \*